United States Patent
Yoshioka et al.

(10) Patent No.: US 11,309,257 B2
(45) Date of Patent: Apr. 19, 2022

(54) SEMICONDUCTOR APPARATUS FOR DETECTING OR OSCILLATING ELECTROMAGNETIC WAVES

(71) Applicant: CANON KABUSHIKI KAISHA, Tokyo (JP)

(72) Inventors: Toshifumi Yoshioka, Hiratsuka (JP); Noriyuki Kaifu, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/773,112

(22) Filed: Jan. 27, 2020

(65) Prior Publication Data
US 2020/0243458 A1  Jul. 30, 2020

(30) Foreign Application Priority Data
Jan. 28, 2019  (JP) .............................. JP2019-011827

(51) Int. Cl.
| H05K 5/00 | (2006.01) |
| H05K 7/00 | (2006.01) |
| H05K 9/00 | (2006.01) |
| H01L 23/552 | (2006.01) |
| G01R 31/00 | (2006.01) |

(52) U.S. Cl.
CPC .......... *H01L 23/552* (2013.01); *G01R 31/001* (2013.01); *H05K 9/0081* (2013.01)

(58) Field of Classification Search
CPC ... H01L 23/552; H01L 23/556; H05K 9/0081; H05K 9/0084; H05K 9/0086; H05K 9/0088
See application file for complete search history.

(56) References Cited

U.S. PATENT DOCUMENTS

| 5,481,400 | A | 1/1996 | Borden | |
| 7,952,441 | B2 | 5/2011 | Koyama et al. | |
| 2005/0212100 | A1* | 9/2005 | Fujimoto | H01L 25/167 257/E31.127 |
| 2012/0241615 | A1* | 9/2012 | Tomioka | H01P 1/2005 250/339.01 |
| 2013/0062524 | A1* | 3/2013 | Takigawa | G01N 21/3581 250/358.1 |
| 2013/0120584 | A1* | 5/2013 | Nakayama | H01S 5/026 348/164 |

(Continued)

FOREIGN PATENT DOCUMENTS

| CN | 104993199 A | 10/2015 |
| EP | 3293772 A | 3/2018 |

(Continued)

OTHER PUBLICATIONS

Extended European Search Report dated May 13, 2020 in corresponding European Patent Appln. No. 20153800.6.

*Primary Examiner* — Anthony M Haughton
(74) *Attorney, Agent, or Firm* — Venable LLP

(57) ABSTRACT

A semiconductor apparatus comprising: an element substrate including a plurality of semiconductor devices which detect or oscillate terahertz waves; and an electromagnetic shielding in a mesh form disposed in front of a surface detecting or oscillating the terahertz waves in the element substrate and formed of a conductive material, wherein a line width of the electromagnetic shielding is not more than a wavelength of the terahertz waves.

11 Claims, 9 Drawing Sheets

(56) References Cited

U.S. PATENT DOCUMENTS

| | | | |
|---|---|---|---|
| 2014/0021353 A1* | 1/2014 | Kondo | G01J 3/0267 |
| | | | 250/341.1 |
| 2014/0247452 A1* | 9/2014 | Kamba | G01N 21/3586 |
| | | | 356/369 |
| 2014/0361170 A1* | 12/2014 | Tomioka | G01J 5/0853 |
| | | | 250/338.3 |
| 2014/0361178 A1* | 12/2014 | Tomioka | G01J 5/34 |
| | | | 250/349 |

FOREIGN PATENT DOCUMENTS

| | | |
|---|---|---|
| JP | 2008-010811 A | 1/2008 |
| JP | 2008-160454 A | 7/2008 |
| WO | 2011/142155 A1 | 11/2011 |

\* cited by examiner

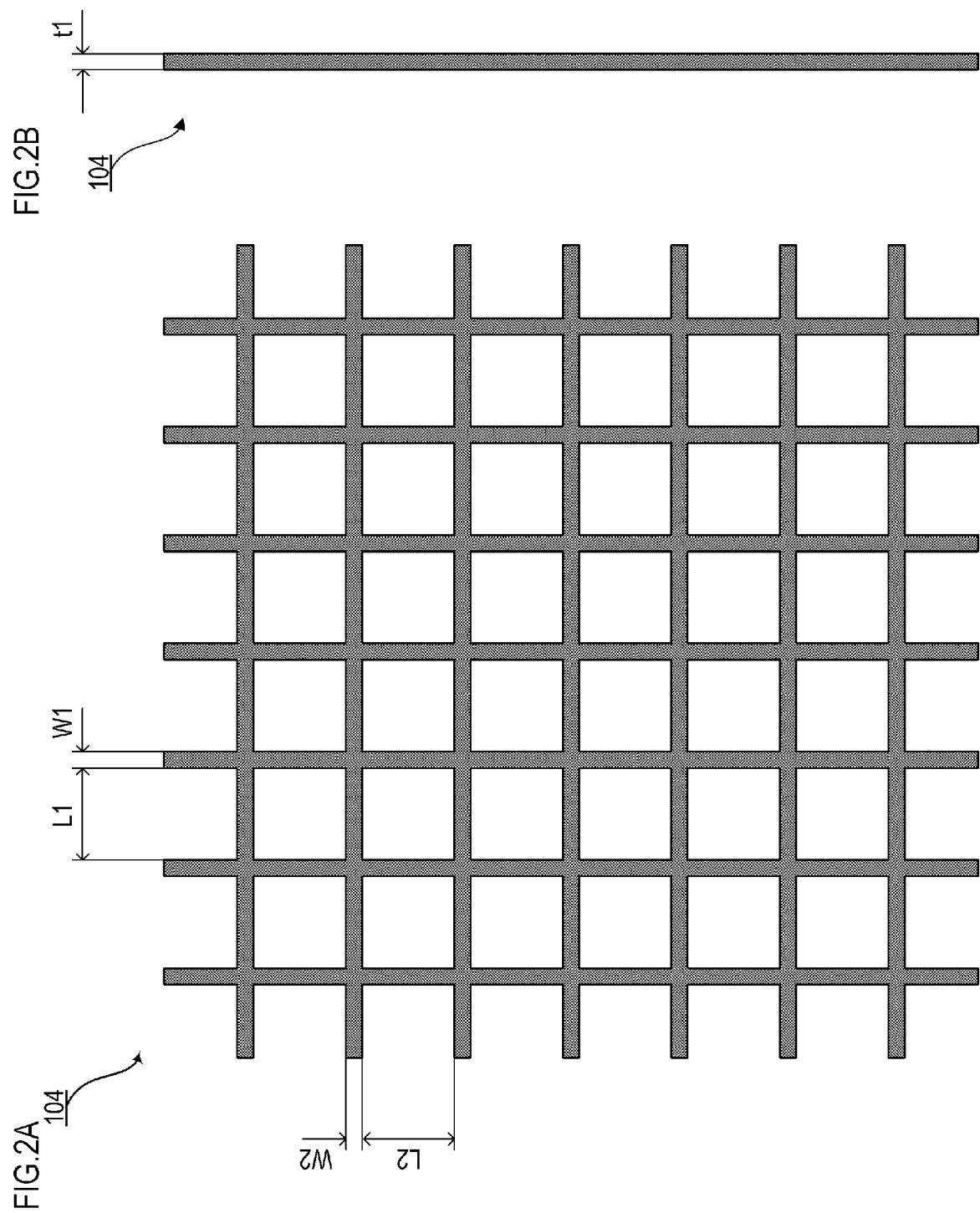

SEMICONDUCTOR APPARATUS FOR DETECTING OR OSCILLATING ELECTROMAGNETIC WAVES

BACKGROUND OF THE INVENTION

Field of the Invention

The present technology relates to a semiconductor apparatus for detecting or oscillating electromagnetic waves.

Description of the Related Art

In general, terahertz waves are electromagnetic waves (radio waves) having signals of any frequency band in a frequency range of 0.3 Thz to 3 Thz. This frequency band has a large amount of characteristic absorption derived from structures or states of various materials including biomolecules and resins. Terahertz waves are hardly affected by scattering and have strong permeability for many materials because they have longer wavelengths than visible light and infrared light. In addition, wavelengths of terahertz waves are shorter than those of millimeter waves that are also electromagnetic waves (radio waves). Accordingly, when a radio-wave camera using terahertz waves (which is also called a terahertz-wave camera) is constructed, images with higher resolution can be expected when compared to millimeter waves. By using these characteristics, application of terahertz waves instead of X rays for a safe imaging technology is expected. For example, application to security check and monitoring techniques in public places is under consideration.

Recently, high picture quality has been required, and demand for high definition and large screens on a detector side and demand for miniaturization and high power on an oscillator side have increased with respect to a terahertz-wave camera (semiconductor apparatus). Accordingly, configurations in which an element which detects or oscillates terahertz waves and a peripheral circuit associated therewith are two-dimensionally arranged are under investment.

In light of this situation, Japanese Unexamined Patent Application Publication No. 2008-10811 discloses a technology for improving a degree of freedom in design of an oscillator to realize a high-density array of oscillation elements and realizing a compact high-power terahertz light source by arranging an oscillation part on one side of a substrate and a power feeding part on the other side. Furthermore, a technology for reducing low frequency noise from a power feeding side by arranging a shield for low frequencies on the lower surfaces of oscillation elements to thereby improve oscillation characteristics is disclosed.

SUMMARY OF THE INVENTION

However, in a configuration in which detection or oscillation elements and a peripheral circuit associated therewith are two-dimensionally arranged, the circuit requires a high operating frequency because rapid reading or rapid control of signals of elements is required to realize high picture quality. Accordingly, unnecessary electromagnetic waves are generated from a substrate surface on which detection or oscillation elements are arranged, a circuit board for reading or control, and the like in a semiconductor apparatus. When some of these unnecessary electromagnetic waves leak to the outside, they have a negative impact on nearby electronic devices, leading to a problem known as electromagnetic interference (EMI).

Therefore, an object of the disclosure of the present technology is, in a semiconductor apparatus which detects or oscillates electromagnetic waves, to prevent leakage of other unnecessary electromagnetic waves.

A first aspect of the technology of the present disclosure is:

a semiconductor apparatus comprising:

an element substrate including a plurality of semiconductor devices which detect or oscillate terahertz waves; and an electromagnetic shielding in a mesh form disposed in front of a surface detecting or oscillating the terahertz waves in the element substrate and formed of a conductive material, wherein a line width of the electromagnetic shielding is not more than a wavelength of the terahertz waves.

A second aspect of the technology of the present disclosure is:

a semiconductor apparatus comprising:

an element substrate including a plurality of semiconductor devices which detect or oscillate predetermined electromagnetic waves; and an electromagnetic shielding in a mesh form disposed in front of a surface detecting or oscillating the predetermined electromagnetic waves in the element substrate and formed of a conductive material, wherein a line width of the electromagnetic shielding is not more than 1 mm.

A third aspect of the technology of the present disclosure is:

a semiconductor apparatus comprising:

an element substrate including a plurality of semiconductor devices which detect or oscillate predetermined electromagnetic waves; and an electromagnetic shielding in a mesh form disposed in front of a surface detecting or oscillating the predetermined electromagnetic waves in the element substrate and formed of a conductive material, wherein a line width of the electromagnetic shielding is not more than a wavelength of the predetermined electromagnetic waves.

According to the disclosure of the present technology, in a semiconductor apparatus which detects or oscillates electromagnetic waves, leakage of unnecessary other electromagnetic waves can be prevented.

Further features of the present invention will become apparent from the following description of exemplary embodiments with reference to the attached drawings.

BRIEF DESCRIPTION OF THE DRAWINGS

FIG. 2A and FIG. 2B are diagrams for describing an electromagnetic shielding according to embodiments 1 and 2;

DESCRIPTION OF THE EMBODIMENTS

Hereinafter, embodiments of the present disclosure will be described with reference to the drawings. In the following description, a semiconductor apparatus which detects or oscillates terahertz waves and prevents unnecessary electromagnetic waves (millimeter waves) from leaking to the outside without obstructing detection or oscillation of terahertz waves by using an electromagnetic shielding in a mesh form will be described. In the following description, it is assumed that terahertz waves are electromagnetic waves (radio waves) having signals of any frequency band in a frequency range of 0.3 Thz to 3 Thz (at least 0.3 Thz and not more than 3 Thz). Furthermore, it is assumed below that millimeter waves are electromagnetic waves (radio waves) having signals of any frequency band in a frequency range of 30 GHz to 300 GHz (at least 30 GHz and less than 300 GHz).

Embodiment 1

Figure 1A:
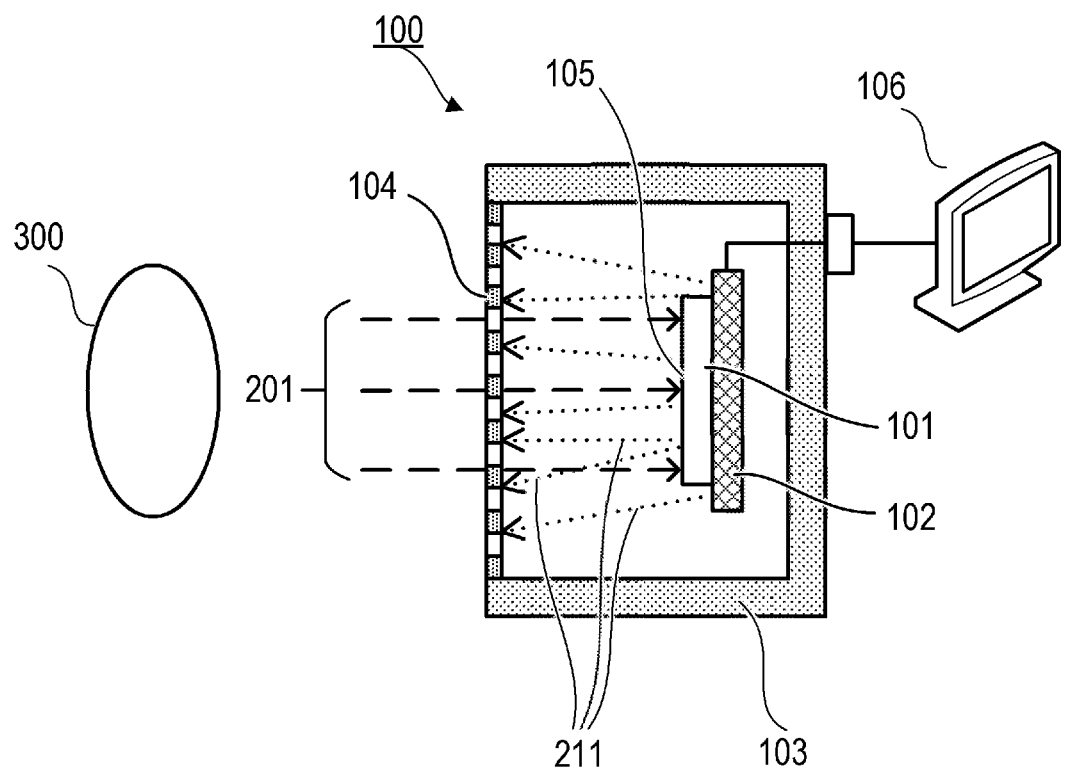
FIG. 1A and FIG. 1B are diagrams for describing a detection apparatus according to embodiment 1.
Figure 1B:
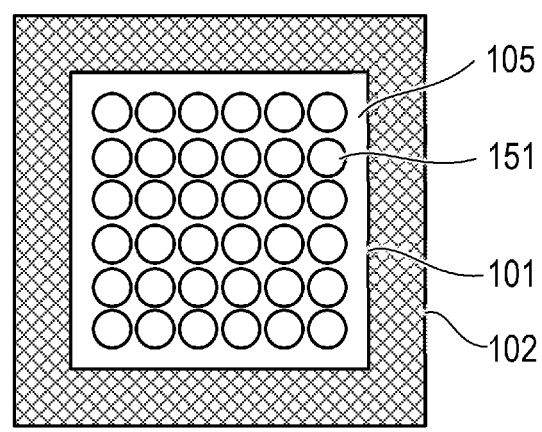

An overview of a terahertz-wave detection apparatus 100 (semiconductor apparatus; terahertz-wave camera) according to embodiment 1 will be described using FIG. 1A to FIG. 2B. FIG. 1A is a diagram for describing a configuration of the detection apparatus 100 and is a side view of the detection apparatus 100. FIG. 1B is a front view of the detection apparatus 100 of FIG. 1A.

The detection apparatus 100 includes an element substrate 101, a circuit board 102, a housing 103, an electromagnetic shielding 104, and a monitor 106. In addition, terahertz waves 201 which are electromagnetic waves are radiated from a test object 300 to the front of the detection apparatus 100. Here, the terahertz waves 201 are terahertz waves generated by the test object 300 according to thermal radiation or terahertz waves radiated from external lighting and reflected by the test object 300. Further, the terahertz waves 201 may be within a frequency range of 0.3 Thz to 3 Thz and thus 0.1 mm to 1 mm can be obtained as wavelengths.

A plurality of elements 151 having spectral sensitivity for the terahertz waves 201 are arranged in a matrix form (two-dimensionally) on the element substrate 101. The elements 151 are, for example, semiconductor devices having a structure in which Schottky barrier diodes (SBDs) fabricated using a compound semiconductor or a semiconductor and antennas are integrated such that they have spectral sensitivity for the terahertz waves 201. Further, the elements 151 may be rectification type detection elements such as self-switching diodes and metal-insulator-metal (MIM) diodes, transistors such as field effect transistors (FETs) and high electron mobility transistors (HEMTs) or detection elements using quantum wells. In a terahertz-wave camera, the elements 151 correspond to pixels.

A circuit which reads signals output from the elements 151 is formed on the circuit board 102 and electrically connected to the elements 151 of the element substrate 101 (not shown). Here, signals output from the elements 151 are related to the terahertz waves 201. The circuit board 102 includes an amplification circuit, a filter circuit, a switch circuit, a power supply circuit, and the like. For example, a general-purpose semiconductor circuit technology such as a CMOS circuit technology can be applied to the circuit board 102. The circuit formed on the circuit board 102 can provide high-definition images by rapidly reading signals from the elements 151 and performing imaging processing thereon as a terahertz-wave camera.

In such a configuration, unnecessary electromagnetic waves 211 are generated from the element substrate 101 on which the elements 151 are arranged, the circuit board 102 and the like due to rapid reading and rapid processing of signals from the elements 151.

In the present embodiment, the circuit board 102 is formed and disposed integrally with the element substrate 101, but the configuration is not limited thereto and the circuit board 102 and the element substrate 101 may be separately formed and separately disposed.

The housing 103 accommodates the element substrate 101 and the circuit board 102. In addition, the housing 103 stores the element substrate 101 and the circuit board 102 at predetermined positions and shields them such that the unnecessary electromagnetic waves 211 do not leak to the outside.

The monitor 106 can display an imaged terahertz wave image. Here, the detection apparatus 100 detects the terahertz waves 201 from the test object 300 and images the terahertz waves 201 through the element substrate 101 and the circuit board 102.

The electromagnetic shielding 104 is formed of a conductive material in a mesh form and disposed in front of a surface 105 of the element substrate 101 which detects the terahertz waves 201. The electromagnetic shielding 104 prevents the aforementioned unnecessary electromagnetic waves 211 generated from the element substrate 101 and the circuit board 102 from leaking to the outside by being formed of the conductive material. Here, the electromagnetic waves 211 are electromagnetic waves that are not more than microwave bands having frequencies not more than several GHz which are increasingly demanded in radio and transceivers as well as recent communications. That is, wavelengths of the electromagnetic waves 211 are greater (longer) than those of the terahertz waves 201.

Here, while the mesh form of the electromagnetic shielding 104 is not particularly limited, an example of a most typical configuration in which thin metal wires are woven in vertical and horizontal directions in a lattice shape at nearly equal intervals is shown in FIG. 2A and FIG. 2B for simplification of explanation. FIG. 2A is a front view of the electromagnetic shielding 104 viewed in an advancing direction of the terahertz waves 201 and FIG. 2B is a side view of the electromagnetic shielding 104.

Hereinafter, conditions for line widths, sizes (widths) of opening portions and a line thickness of the electromagnetic shielding 104 for preventing leakage of the electromagnetic waves 211 without obstructing detection of the terahertz waves 201 will be described.

Conditions for Line Width

First, line widths W1 and W2 of the electromagnetic shielding 104 are set such that they are not more than the wavelength of the terahertz waves 201 used for detection, desirably not more than ½ of the wavelength, and more desirably not more than ⅕ of the wavelength.

According to this, the terahertz waves 201 radiated from the test object 300 can arrive at the elements 151 while receiving little influence from the mesh-form electromagnetic shielding because obstacles that are smaller than the waveform have little influence on electromagnetic waves (radio waves).

Conditions for Sizes of Opening Portions

In the present embodiment, sizes (widths) L1 and L2 of opening portions of the electromagnetic shielding 104 are set such that they are at least the wavelength of the terahertz waves 201 detected by the elements 151 and not more than ½ of the wavelength of the electromagnetic waves 211 to be shielded. Here, in order to shield the electromagnetic waves 211 using the conductive material of the mesh, it is necessary to set the sizes L1 and L2 of the opening portions of the mesh to be no more than at least half the wavelength of the electromagnetic waves 211 such that the wavelength of the electromagnetic waves 211 is a shielding wavelength. Further, the electromagnetic waves 211 to be shielded (to be prevented from leaking) are desirably millimeter waves. Here, millimeter waves are electromagnetic waves having signals of any frequency band in a frequency range of 30 GHz to 300 GHz (at least 30 GHz and not more than 300 GHz), as described above. Accordingly, millimeter waves can have values greater than 1.0 mm and not more than 10.0 mm as wavelengths. Meanwhile, in order to suppress the electromagnetic waves 211 from leaking to the surroundings and obtain a sufficient shielding effect (shield effect), it is desirable that the sizes L1 and L2 of the opening portions of the mesh be smaller and it is more desirable that they not be more than ⅕ of the wavelength of the electromagnetic waves 211, and even more desirable that they be ¹⁄₁₀ of the wavelength.

Furthermore, the sizes L1 and L2 of the opening portions of the electromagnetic shielding 104 also need to be at least the wavelength of the terahertz waves 201 detected by the elements 151. This is for the purpose of causing the terahertz waves 201 radiated from the test object 300 to arrive at the elements 151 while receiving little influence from the electromagnetic shielding 104. If these conditions for the sizes of the opening portions of the electromagnetic shielding 104 are satisfied, a high-definition terahertz-wave camera using the terahertz waves 201 can be provided.

In addition, since the sizes L1 and L2 of the opening portions are not more than ½ of the wavelength of the unnecessary electromagnetic waves 211 generated from the element substrate 101 and the circuit board 102, it is possible to effectively shield the electromagnetic waves 211 to suppress leakage to the outside and prevent electromagnetic interference (radio interference).

Conditions for Line Thickness

A line thickness t1 of the electromagnetic shielding 104 shown in FIG. 2B is set such that it is not more than the wavelength of the terahertz waves 201 used for detection, desirably not more than ½ of the wavelength because the line affects the terahertz waves 201 when it is excessively thick.

Summary of Conditions for Electromagnetic Shielding

That is, it is possible to effectively shield the unnecessary electromagnetic waves 211 without obstructing detection of the terahertz waves 201 according to presence of the electromagnetic shielding 104. In addition, when the wavelength of the terahertz waves 201 in the present embodiment is defined as λ and the wavelength of the electromagnetic waves 211 to be shielded is defined as λ2, the line widths W1 and W2 or the line thickness t1 of the electromagnetic shielding 104 satisfies (1) or (3) below. Accordingly, the effect that detection of the terahertz waves 201 is not obstructed can be additionally obtained. Furthermore, it is possible to shield the unnecessary electromagnetic waves 211 from leaking to the outside more effectively without obstructing detection of the terahertz waves 201 when the sizes (widths) L1 and L2 of the opening portions of the electromagnetic shielding 104 satisfy (2) below.

$$W1 \leq \lambda \text{ and } W2 \leq \lambda \tag{1}$$

$$\lambda \leq L1 \leq \lambda2/2 \text{ and } \lambda \leq L2 \leq \lambda2/2 \tag{2}$$

$$t1 \leq \lambda \tag{3}$$

Other Shapes of Electromagnetic Shielding

Other examples of the mesh form of the electromagnetic shielding 104 will be described using FIG. 3 to FIG. 5.

Diamond Shape

Figure 3:
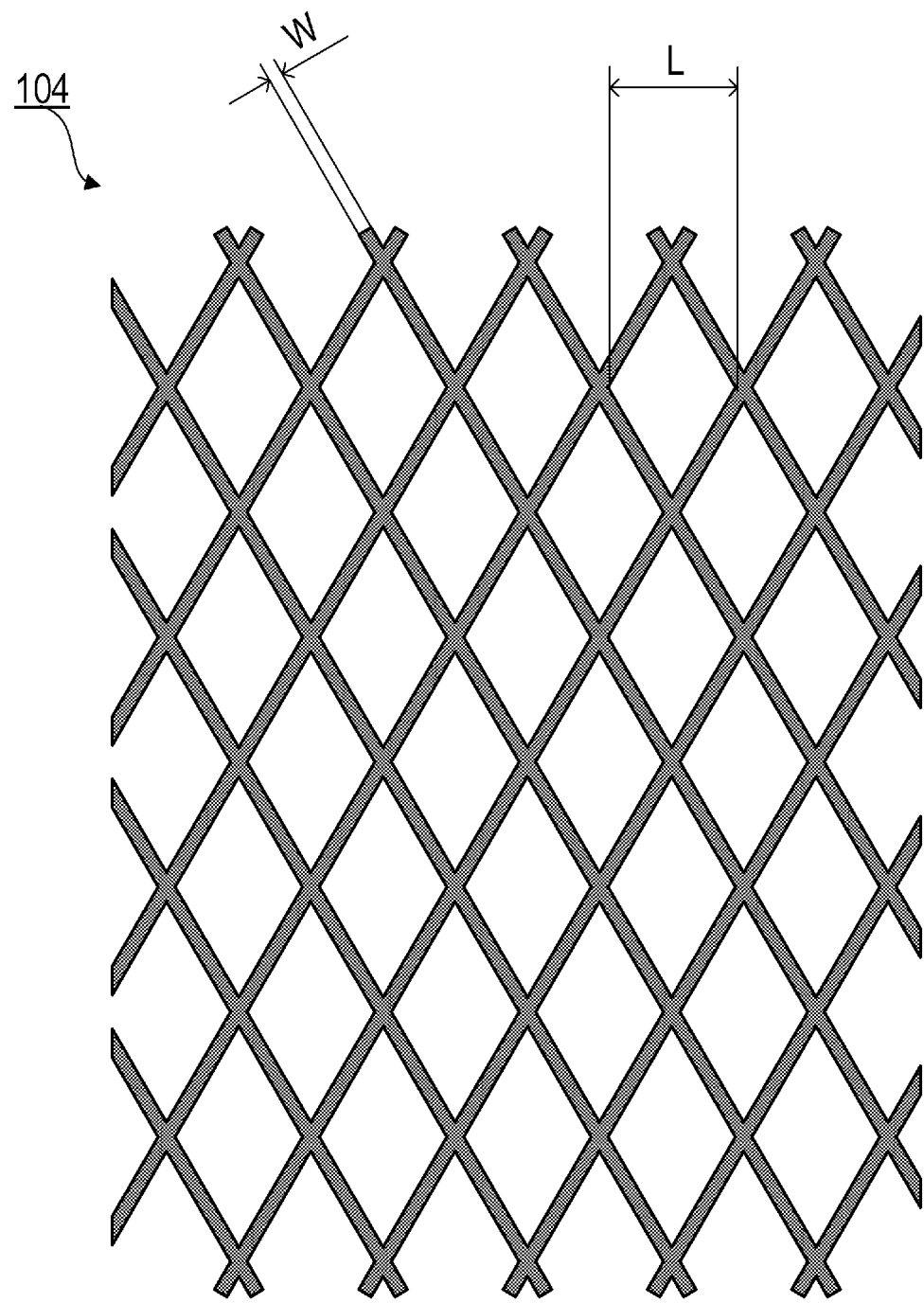
FIG. 3 is a diagram for describing another electromagnetic shielding according to embodiment 1.

The electromagnetic shielding 104 of FIG. 3 has metal wires which are arranged such that opening portions have a diamond shape. In such a mesh form, it is desirable that the length L (the size of opening portions; the length of a shorter diagonal line) of a shorter one of distances between opposite vertexes in the opening portions be set to no more than ½ of the wavelength of the electromagnetic waves 211 required to be shielded. Here, it is desirable that the length L be at least the wavelength of the terahertz waves 201 such that detection of the terahertz waves 201 is not obstructed. Furthermore, it is desirable that a line width W and a line thickness t1 (not shown) also be set to at least no more than the wavelength of the terahertz waves 201 to be detected.

Hexagonal Shape

Figure 4:
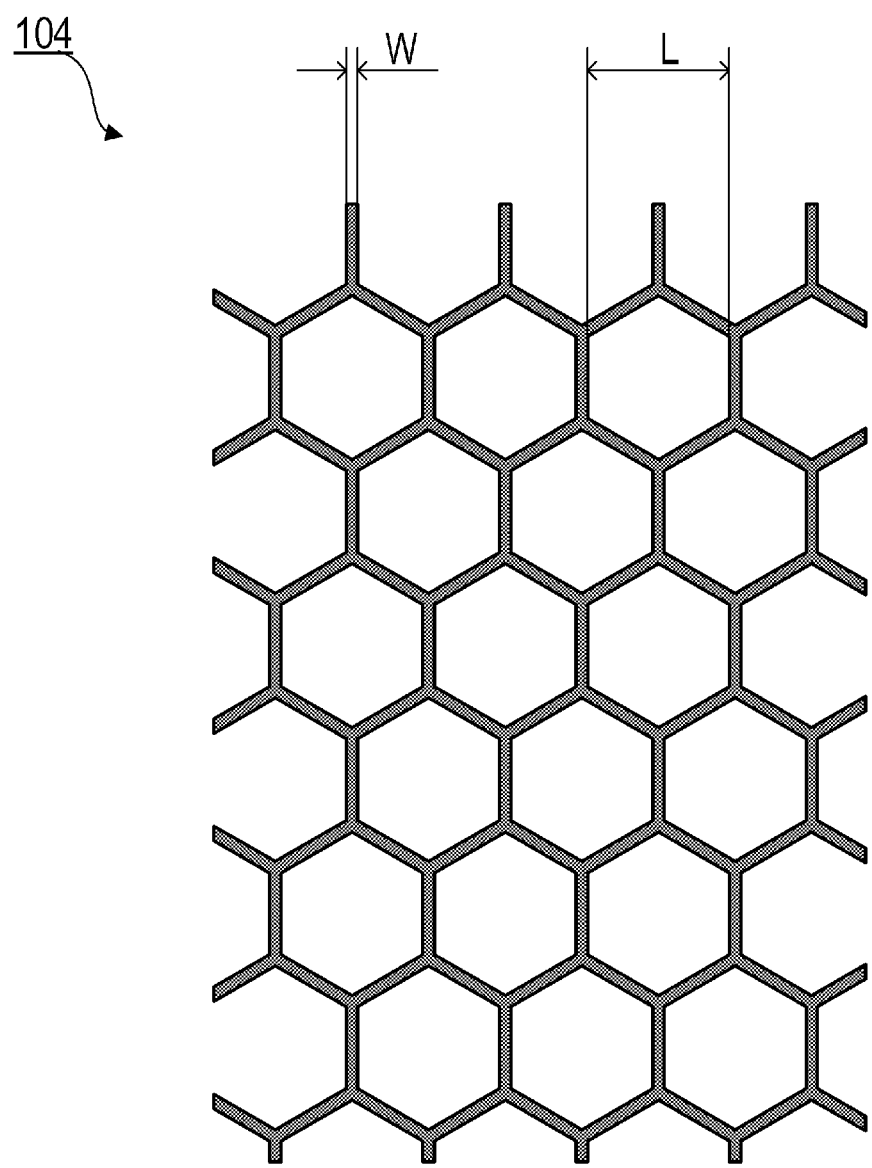
FIG. 4 is a diagram for describing another electromagnetic shielding according to embodiment 1.

The electromagnetic shielding 104 of FIG. 4 has metal wires which are arranged such that opening portions have a hexagonal shape. In such a mesh form, it is also desirable that a distance L (the size of the opening portions) between two opposite sides in the opening portions be set to no more than ½ of the wavelength of the electromagnetic waves 211 required to be shielded. Here, it is desirable that the length L be at least the wavelength of the terahertz waves 201 such that detection of the terahertz waves 201 is not obstructed. Furthermore, it is desirable that a line width W and a line thickness t1 (not shown) also be set to at least no more than the wavelength of the terahertz waves 201 to be detected.

Meanwhile, with respect to the electromagnetic shielding 104 having different widths of opening portions depending on directions like the shapes shown in FIG. 3 and FIG. 4, dimensions, installation directions and the like can be appropriately set in consideration of a polarization direction of the electromagnetic waves 211 to be shielded and the like.

Honeycomb Dot Shape

Figure 5:
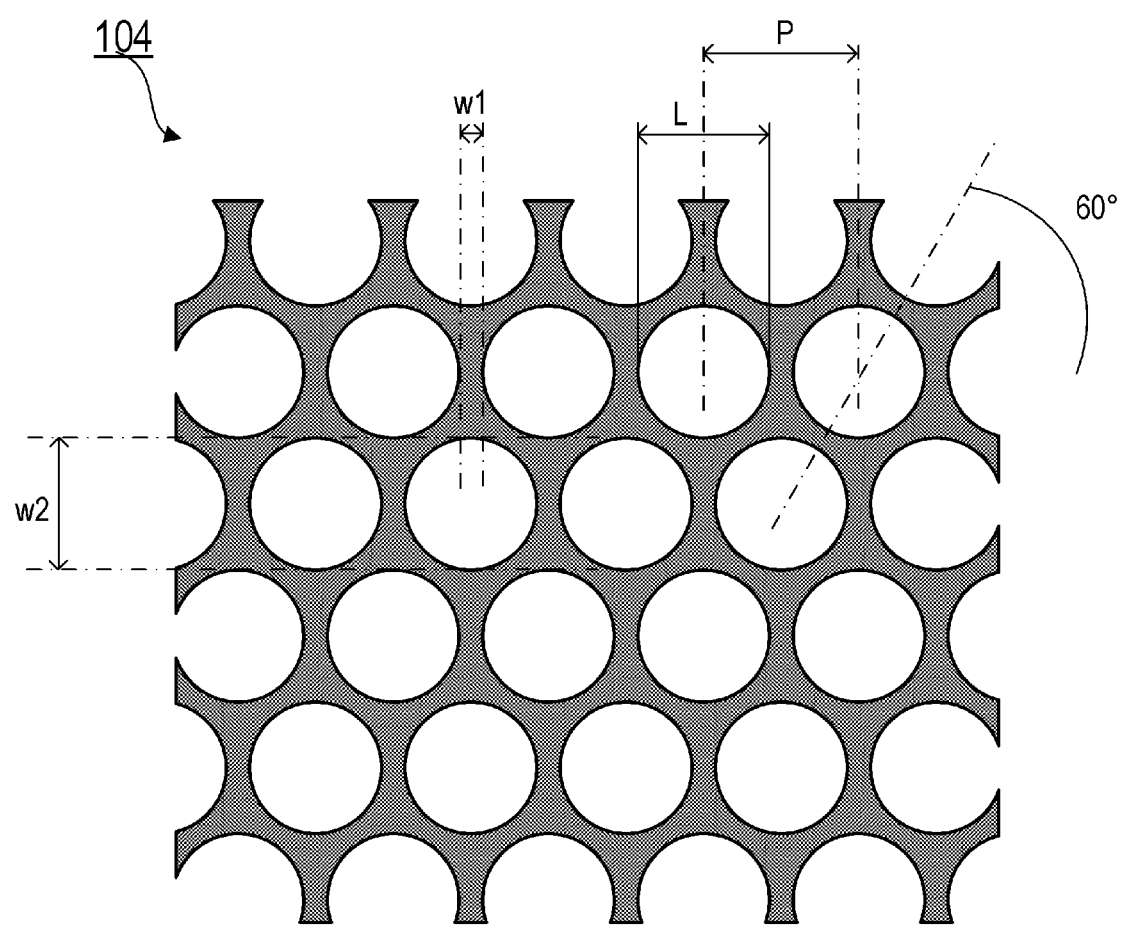
FIG. 5 is a diagram for describing another electromagnetic shielding according to embodiment 1.

In the electromagnetic shielding 104 of FIG. 5, circular opening portions with a diameter L are arranged honeycomb dot (zigzag) at an adjacent pitch P (adjacent interval) in directions of 0° and 60°. In addition, the diameter L of the opening portions (the size of the opening portions) is set to no more than ½ of the wavelength of the electromagnetic waves 211 required to be shielded. Here, it is desirable that the diameter L be at least the wavelength of the terahertz waves 201 such that detection of the terahertz waves 201 is not obstructed. Meanwhile, when the aforementioned examples of various shapes of the electromagnetic shielding 104 are taken into account, the size (width) of the opening portions can be regarded as twice a shortest distance between the center position of an opening portion and the metal wire forming the opening portion. Furthermore, the size (width) of the opening portions can also be regarded as a shortest length, which is included in the insides of a corresponding opening portion (first opening portion) and another opening portion (second opening portion), of a line segment connecting the center position of the corresponding opening portion (first opening portion) and a center position of another opening portion (second opening portion) adjacent to the corresponding opening portion. In addition, the size (width) of the opening portions can also be regarded as a shortest length, which is included in the insides of a corresponding opening portion (first opening portion) and another opening portion (second opening portion), of a straight line connecting the center position of the corresponding opening portion (first opening portion) and a center position of another opening portion (second opening portion) adjacent to the corresponding opening portion.

For the zigzag-shaped mesh shown in FIG. 5, a processing method such as punching processing, etching, laser processing or expanding a metal plate is generally used. The circular opening portions can uniformly shield the electromagnetic waves 211 without depending on a polarization direction of the electromagnetic waves 211 to be shielded and thus have the advantage of easy placement. Here, regarding the line widths W when the light-shielding portions are not on uniform lines as shown in FIG. 5, an average line width is defined as W in consideration of the overall influence on the terahertz waves 201. Here, the width W is, for example, the average of an interval w1 between opening portions neighboring in the 0° direction and an interval w2 (the size L of the opening portions) between opening portions neighboring in the 90° direction. In addition, it is desirable that the line width W and the line thickness t1 of the electromagnetic shielding 104 (not shown) be set to at least no more than the wavelength of the terahertz waves 201 to be detected.

Meanwhile, the shape of the electromagnetic shielding 104 are not limited to the shapes shown in FIG. 2A to FIG. 5 and other polygonal shapes, an oval shape, an elliptical shape, additionally deformed shapes, and the like can be appropriately selected in consideration of the wavelength and polarization direction of the electromagnetic waves 211 to be shielded, ease of processing of members, and the like. Furthermore, a manufacturing method of the electromagnetic shielding 104 is not limited to metal wire weaving and can be arbitrarily determined as weaving or bonding of a fiber containing a conductive material, etching, laser processing or expanding a conductive plate, or the like in view of easiness of handling considering necessary dimensions and costs. Moreover, a manufacturing method of patterning a conductive film on a quartz substrate or a polyethylene substrate having a high permeability for the terahertz waves 201 can also be selected.

Embodiment 2

Figure 7A:
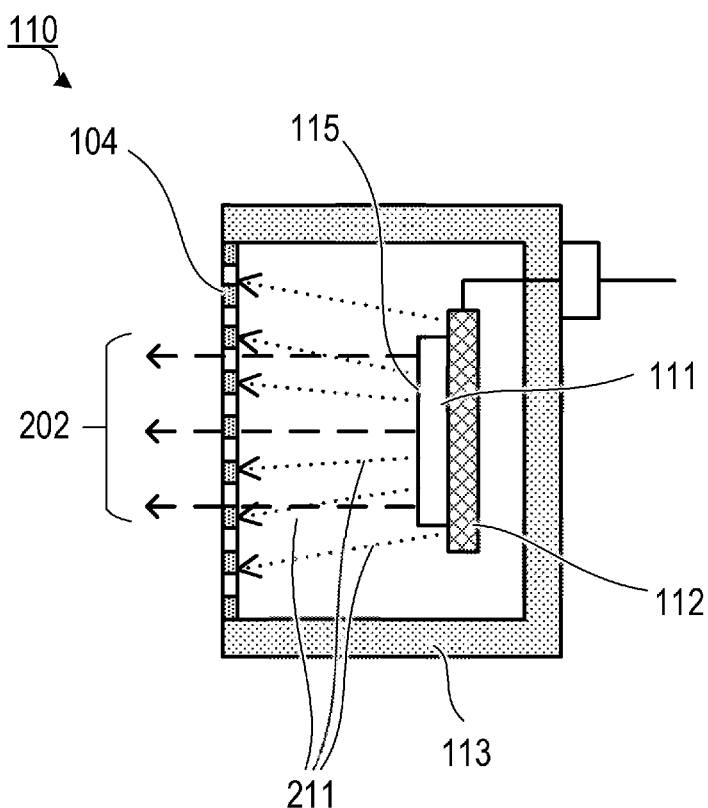
FIG. 7A and FIG. 7B are diagrams for describing an oscillation apparatus according to embodiment 2.
Figure 7B:
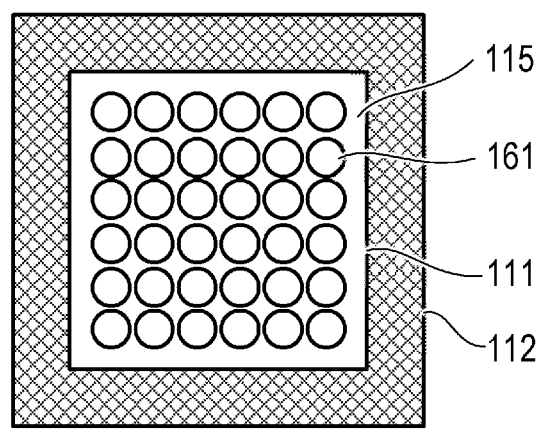

A terahertz wave reception apparatus is used in embodiment 1, whereas a terahertz wave oscillation apparatus (semiconductor apparatus) is used in embodiment 2. FIG. 7A and FIG. 7B are schematic configuration diagrams of an oscillation apparatus (terahertz light source) in the present embodiment.

FIG. 7A is a diagram for describing a configuration of an oscillation apparatus 110 and is a side view of the oscillation apparatus 110. FIG. 7B is a diagram for describing a component near an element substrate 111 which oscillates terahertz waves and is a front view with respect to oscillating terahertz waves 202 of FIG. 7A.

The oscillation apparatus 110 includes the element substrate 111 on which a plurality of elements 161 which oscillate the terahertz waves 202 are formed in a matrix form (two-dimensionally), and a circuit board 112 which controls the elements 161. These components are accommodated in a housing 113, and the housing 113 has functions of storing these components at predetermined positions and shielding unnecessary electromagnetic waves 211 from leakage to the outside.

In addition, the electromagnetic shielding 104 is disposed in front of the surface 115 of the element substrate 111 which oscillates the terahertz waves 202.

An oscillation element including an active element (negative resistance element) such as a resonance tunnel diode, an Esaki diode or a Gunn diode and a resonance structure (antenna) can be used as the elements 161. The configuration of the elements 161 is not limited thereto and known terahertz-wave oscillating devices (semiconductor devices) may be used.

A driving circuit for oscillating the terahertz waves 202 from the elements 161 and controlling them is formed on the circuit board 112. The circuit board 112 is electrically connected to the respective elements 161 of the element substrate 111. That is, the driving circuit in the circuit board 112 oscillates the terahertz waves 202 from the elements 161 by driving the respective elements 161 of the element substrate 111. The circuit board 112 includes a filter circuit, a switch circuit, a power supply circuit and the like, and a general-purpose semiconductor circuit technology, for example, a CMOS circuit technology, can be applied thereto.

In the oscillation apparatus 110 having this configuration, the unnecessary electromagnetic waves 211 are generated from the element substrate 111 on which the elements 161 are arranged, the circuit board 112 and the like due to rapid driving or rapid processing of the elements 161 as in the detection apparatus 100 described in embodiment 1.

The electromagnetic shielding 104 is disposed in front of the surface 115 of the element substrate 111 which oscillates the terahertz waves 202, and transmits the necessary terahertz waves 202 and while shielding the unnecessary electromagnetic waves 211 as in embodiment 1.

Meanwhile, the configuration of the electromagnetic shielding 104 is the same as that of FIG. 2A and FIG. 2B shown in embodiment 1. In addition, conditions for line widths W1 and W2, conditions for sizes L1 and L2 of opening portions and conditions for a line thickness t1 in the electromagnetic shielding 104 are the same as those when "terahertz waves 201" is replaced with "terahertz waves 202" in embodiment 1.

Accordingly, it is possible to shield the unnecessary electromagnetic waves 211 without obstructing oscillation of the terahertz waves 202 in the present embodiment.

Example 1

The detection apparatus 100 according to example 1 that is a specific example of embodiment 1 will be described with reference to FIG. 1A to FIG. 2B.

Here, the detection apparatus 100 is a radio-wave camera, and radio-wave cameras include a passive type that selects and detects desired radio waves from among electromagnetic waves (radio waves and light) generated from a test object according to thermal radiation, and an active type that detects reflected radio waves obtained by radiating desired radio waves to a test object. Many passive type radio-wave cameras realize selection of radio waves and low nose of a system using a high-frequency circuit such as a mixer because radio waves generated from a test object according to thermal radiation are very weak. Since high-frequency circuit technology operating in the terahertz band is under development, there are many ongoing studies on an active type terahertz-wave camera in order to secure a necessary SN ratio. Meanwhile, a terahertz-wave camera of the present example is an active type terahertz-wave camera which radiates terahertz waves to a test object.

In the present example, the terahertz waves 201 are reflected waves that have been radiated to the test object 300 from a terahertz-wave lighting which is not shown and reflected by the test object 300. The terahertz-wave lighting uses a surface light source in which a plurality of terahertz-wave light sources are arranged in a matrix form. More specifically, a terahertz wave source is an element in which a resonance tunnel diode (RTD) and a patch antenna that is a resonator are integrated, and the output of the terahertz wave source is slightly less than 0.1 mW. In this example, terahertz-wave lighting is a surface light source in which terahertz wave sources are arranged as 25 elements. Meanwhile, the number of arranged terahertz-wave sources is not limited thereto. Further, the configuration of the terahertz-wave sources is not also limited thereto and known terahertz-wave light sources can be used.

As the elements 151 which detect the terahertz waves 201, Schottky barrier diodes (SBDs) in which antennas are integrated are used. Antennas are loop antennas and a resonant frequency of the antennas is adjusted to a frequency of the terahertz waves 201 generated from RTDs, 0.5 THz. In addition, the elements 151 are photoelectric conversion elements which convert signals of the terahertz waves 201 into electrical signals.

A total of 22,500 elements 151 are arranged in 150 rows×150 columns in a matrix form (two-dimensionally) on the surface of the element substrate 101. The element substrate 101 has a size of 55 mm×55 mm.

The circuit board 102 includes a line reading circuit formed thereon and is composed of a switch circuit and a shift register circuit for selecting a line, a bias circuit for determining operating points of the elements 151 of the element substrate 101, a circuit for converting outputs of the elements 151 into charge signals, and the like. These circuits are formed on a silicon-based semiconductor substrate.

Output of the circuit board 102 is connected to an amplification circuit, a filter circuit, a correlated double sampling (CDS) circuit and the like which are not shown such that signals related to the terahertz waves 201 are adjusted. These circuits may be included in the circuit board 102. The detection apparatus 100 acquires a strength distribution of signals related to the terahertz waves 201 by sequentially selecting rows of the element substrate 101 (sensor part) and acquiring signals of elements 151 included in the rows. In addition, the detection apparatus 100 constructs strength distribution images of the terahertz waves 201 (which are also called terahertz wave images) by arranging the signals of the strength distribution with reference to row selection positions of the element substrate 101. In construction, the detection apparatus 100 may perform image processing such as averaging of terahertz wave images, removal of unnecessary fixed patterns, and γ correction.

In addition, the monitor 106 presents terahertz wave images to a user in the present example.

The electromagnetic shielding 104 is an electromagnetic shielding in a metal mesh shape in which thin metal wires are woven in vertical and horizontal directions at approximately equal intervals, shown in FIG. 2A.

In addition, line widths W1 and W2 and a line thickness t of the electromagnetic shielding 104 are set to 0.12 mm (λ/5) and sizes L1 and L2 of opening portions are set to 6 mm for the frequency 0.5 THz (wavelength λ=0.6 mm) of the terahertz waves 201 detected by the elements 151. According to this configuration, it is possible to shield electromagnetic noise of not more than the microwave band used for communication and the like without attenuating the terahertz waves 201 to be detected, which will be described in detail later.

Meanwhile, the line widths W1 and W2 and the sizes L1 and L2 of the opening portions of the electromagnetic shielding 104 are not limited thereto and can be appropriately set depending on frequencies of the terahertz waves 201 to be used, the electromagnetic waves 211 to be shielded and the shielding effect. Furthermore, the configuration of the electromagnetic shielding 104 and the form of the mesh are not limited to the lattice shape shown in FIG. 2A, and a mesh shape, material and manufacturing method can be appropriately selected in consideration of the shielding effect and easiness of handling members.

Operations of Terahertz Waves and Electromagnetic Waves

Here, operations of the terahertz waves 201 and unnecessary electromagnetic waves 211 in the present example will be described. The terahertz waves 201 radiated from a terahertz-wave lighting to the test object 300 and reflected from the test object 300 passes through the electromagnetic shielding 104 and then reaches the element substrate 101. While the terahertz waves 201 have a wavelength λ of 0.6 mm, the line widths W1 and W2 and thickness t of the electromagnetic shielding 104 are 0.12 mm which is sufficiently thin and the thickness is also sufficiently thin. Accordingly, the terahertz waves 201 hardly attenuate when passing. This is because scattering or reflection occurs when a material present on a path of incident electromagnetic waves is larger than the wavelength of the electromagnetic waves but scattering or reflection hardly occurs and attenuation is insignificant when the material is smaller or thinner than the wavelength. The terahertz waves 201 arrived at the element substrate 101 are subjected to image processing, as described above, and reflected (displayed) on the monitor 106 as terahertz wave images. Here, the terahertz waves 201 arrived at the element substrate 101 hardly attenuate and thus are displayed as fine images.

Simultaneously, high-frequency current flows through electronic elements and wires in the circuit board 102 and an image processing circuit or a high voltage is applied thereto, and thus the high-frequency electromagnetic waves 211 are generated. It is known that the generated electromagnetic waves 211 have a large amount of frequency components of several MHz to several GHz and components of 10 GHz or higher are hardly generated. The electromagnetic waves 211 propagates in various directions from a place where they have been generated. Although some of the electromagnetic waves 211 are input to the rear surface and side of the housing 103, the electromagnetic waves 211 are reflected or absorbed without leaking to the outside after input to the housing 103 because the housing 103 is formed of a conductive material.

In addition, the electromagnetic waves 211 are input to the electromagnetic shielding 104 like the terahertz waves 201. While the electromagnetic waves 211 of several MHz to several GHz have a wavelength of at least 30 mm, the sizes L1 and L2 of the opening portions are 6 mm less than λ/2 which is sufficiently narrow. Accordingly, the electromagnetic waves 211 cannot transmit the electromagnetic shielding 104 and are reflected or absorbed by the electromagnetic shielding 104. Generally, it is known that electromagnetic waves have difficulty passing through opening portions present on the path of the electromagnetic waves and narrower than λ/2. This is because a lowest resonant frequency in the opening portions is the frequency of λ/2 that is the opening width and electromagnetic waves having frequencies lower than the frequency attenuate. That is, the electromagnetic waves 211 do not go outside of the camera, and thus do not cause a problem of so-called electromagnetic interference (EMI) in which electromagnetic waves have a negative impact on electronic devices in the vicinity.

Even if some of frequencies higher than several MHz to several GHz in the electromagnetic waves 211 go outside of the camera, nearby electronic devices do not malfunction at electromagnetic waves of the corresponding frequencies and the frequencies are not used for communication, and thus problems do not occur. In this manner, the detection apparatus 100 transmits electromagnetic waves (terahertz waves 201) necessary for detection and imaging and prevents leakage of the unnecessary electromagnetic waves 211 and thus it operates as a terahertz-wave camera which obtains high-definition clear images. Although the unnecessary electromagnetic waves 211 can be prevented from leaking, for example, by the housing 103 that is a metal plate on the side and rear surface of the camera, in general, imaging cannot be performed if a subject direction is shielded by the metal plate. With respect to this, it is possible to prevent leakage of the unnecessary electromagnetic waves 211 without deteriorating characteristics of the camera in the present example.

Furthermore, the frequency of the electromagnetic waves 211 to be shielded can be determined depending on social communication devices or environments. In general, the frequency of the electromagnetic waves 211 for which suppression of leakage is considered is assumed to be up to 6 GHz according to CISPR22 standard determined by International Special Committee on Radio Interference (CISPR) in many cases. This is because currently used communication devices are considered to be influenced by electromagnetic environments of up to 6 GHz and thus the influence is required to be suppressed socially. Accordingly, at the present time, when the electromagnetic waves 211 at frequencies of not more than 6 GHz are shielded, the influence on other devices can be suppressed.

Meanwhile, although an example of a case in which the frequency of the terahertz waves 201 is 0.5 THz (wavelength $\lambda$=0.6 mm) is represented in the present example, a low frequency among frequencies that the terahertz waves 201 can take is 300 GHz (wavelength $\lambda$=1 mm). Accordingly, the widths W1 and W2 of the electromagnetic shielding 104 may be not more than 1 mm. The thickness t1 of the electromagnetic shielding 104 may also be not more than 1 mm for the same reason as that for the widths.

As described above, the unnecessary electromagnetic waves 211 which become a problem due to leakage are regarded as not more than 6 GHz in the present social environment. To attenuate the unnecessary electromagnetic waves 211 that are not more than 6 GHz (wavelength 50.0 mm), it is desirable that the sizes L1 and L2 of the opening portions of the electromagnetic shielding 104 be set to no more than 25.0 mm (not more than 25 mm). Further, it is also expected that frequencies of electromagnetic waves which become a problem due to leakage exceed 6 GHz due to recent development of high-frequency devices. Electromagnetic waves of up to 100 GHz are considered even in recommendation "ITU-RP. 372-8" of the International Telecommunication Union (ITU). In addition, electromagnetic waves at frequencies of at least 100 GHz greatly attenuate in the air and thus do not become a problem. Considering this, it is desirable that the sizes L1 and L2 of the opening portions of the electromagnetic shielding 104 be set to no more than 1.5 mm in order to attenuate the unnecessary electromagnetic waves 211 that are not more than 100 GHz (wavelength 3 mm). According to this, it is possible to suppress the influence of unnecessary interfering electromagnetic waves with respect to all frequencies for which a leakage problem is conceived and provide a camera (semiconductor apparatus) which does not have a negative impact on other communication devices.

Example 2

The detection apparatus 100 (terahertz-wave camera) of example 2 that is a specific example of embodiment 1 will be described using FIG. 6A that is a schematic configuration diagram. Description of the same parts as those of example 1 is omitted.

Figure 6A:
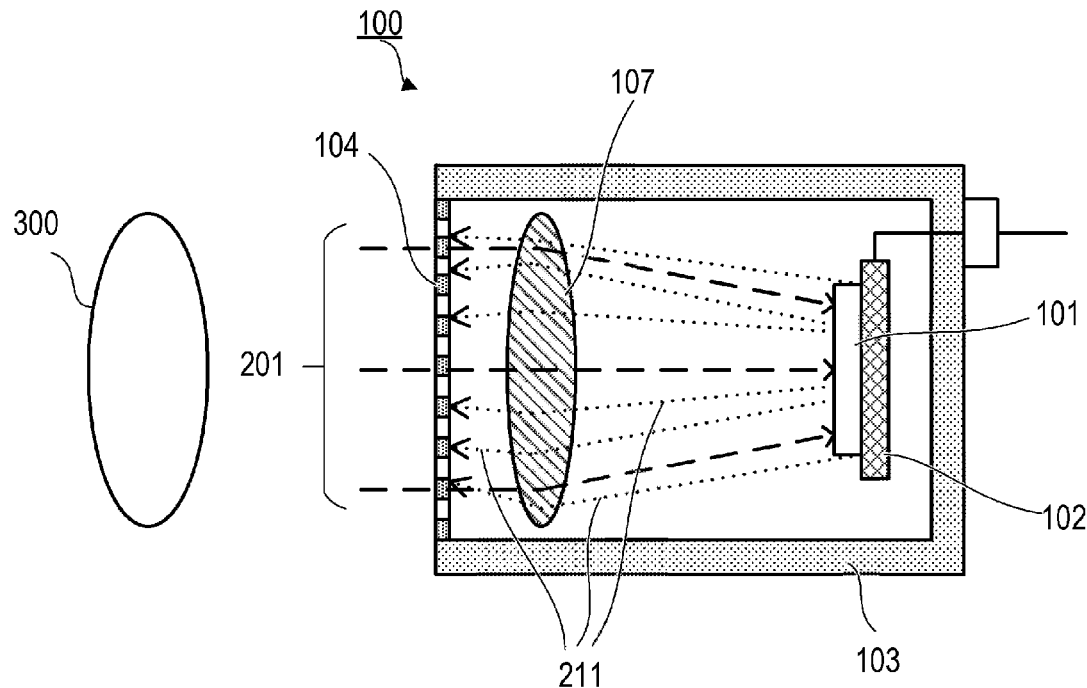
FIG. 6A is a diagram for describing a detection apparatus according to embodiment 2.

As shown in FIG. 6A, a lens 107 is disposed between the element substrate 101 and the electromagnetic shielding 104. The element substrate 101 includes the elements 151 which detect the terahertz waves 201. That is, the lens 107 is disposed in front of the surface 105 of the element substrate 101 which detects the terahertz waves 201.

The terahertz waves 201 radiated from the test object 300 are focused by the lens 107 and imaged on the plurality of elements 151 formed on the element substrate 101. That is, the optical path of the terahertz waves 201 is controlled by the lens 107. Accordingly, the detection apparatus 100 can obtain clearer terahertz wave images than those in example 1.

A material that transmits the terahertz waves 201 can be applied as a material of the lens 107. More specifically, a high-density polyethylene (HDPE), a Teflon (™ (registered trademark); PolyTetraFluoroethylene (PTFE)), a high-resistance silicon or the like can be applied as a material of the lens 107.

In addition, the frequency of the terahertz waves 201 to be detected by the elements 151 is set to 2.0 THz (wavelength $\lambda$=0.15 mm) in the present example. Furthermore, the line widths W1 and W2 and thickness t of the electromagnetic shielding 104 are set to 0.05 mm ($\lambda$/3) and the sizes L1 and L2 of the opening portions are set to 0.15 mm That is, the sizes L1 and L2 of the opening portions of the electromagnetic shielding 104 are not more than 1.5 mm which can attenuate the unnecessary electromagnetic waves 211 that are not more than 100 GHz (wavelength 3 mm), and thus electromagnetic waves expected to be used for future communication can also be sufficiently shielded.

Example 3

Figure 6B:
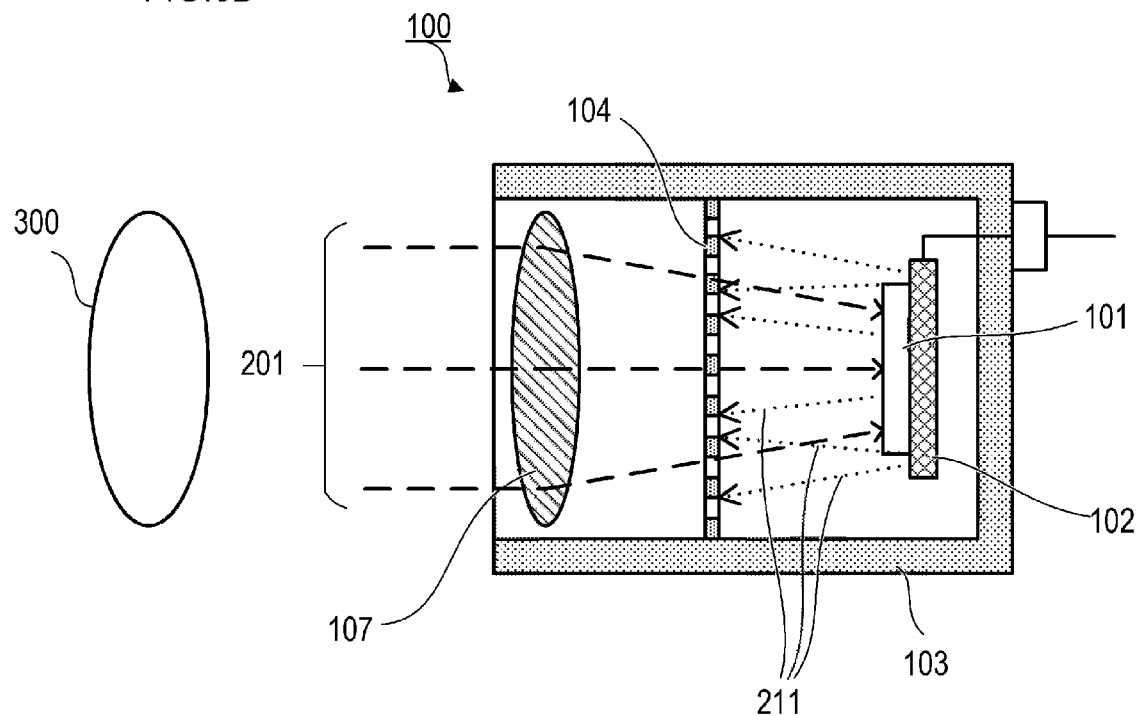
FIG. 6B is a diagram for describing a detection apparatus according to embodiment 3.

The detection apparatus 100 (terahertz-wave camera) of example 3 that is a specific example of embodiment 1 will be described using FIG. 6B that is a schematic configuration diagram. Description of the same parts as those of example 2 is omitted.

Although the lens 107 is disposed between the electromagnetic shielding 104 and the element substrate 101 in example 2, the electromagnetic shielding 104 is disposed between the element substrate 101 and the lens 107 in example 3. According to this configuration, it is possible to realize a more compact (smaller) detection apparatus 100 than that of example 2.

Example 4

Example 4 that is a specific example of embodiment 2 will be described with reference to FIG. 7A and FIG. 7B. Description of parts described in embodiment 2 is omitted.

The elements 161 are elements (semiconductor devices) in which resonance tunnel diodes (RTDs) and patch antennas that are resonators are integrated and outputs of the elements 161 are a little less than 0.1 mW. In example 4, 100 elements 161 having an oscillation frequency set to 0.375 THz (wavelength λ=0.8 mm) are arranged in 10 rows×10 columns in a matrix form. Meanwhile, the number of arranged elements 161 is not limited thereto. Further, the configuration of the elements 161 is not also limited thereto and known terahertz-wave oscillation devices can be used.

A driving circuit for oscillating and controlling terahertz waves 202 from the elements 161 is formed on the circuit board 112. The circuit board 112 is electrically connected to the respective elements 161 of the element substrate 111. The circuit board 112 includes a filter circuit, a switch circuit, a power supply circuit and the like, and a general-purpose semiconductor circuit technology, for example, a CMOS circuit technology can be applied thereto.

In the oscillation apparatus 110 having this configuration, unnecessary electromagnetic waves 211 are generated from the element substrate 111 on which the elements 161 are arranged, the circuit board 112 and the like due to rapid driving or rapid processing of the elements 161 as in the detection apparatus 100 described in examples 1 to 3.

The electromagnetic shielding 104 is disposed in front of the surface 115 of the element substrate 111 which oscillates the terahertz waves 202. The electromagnetic shielding 104 transmits the necessary terahertz waves 202 and shields the unnecessary electromagnetic waves 211 as in examples 1 to 3. In addition, the electromagnetic shielding 104 is configured such that the line widths W1 and W2 are not more than the wavelength λ of the terahertz waves 202 to be oscillated, desirably not more than ½ of the wavelength λ, more desirably not more than ⅕ of the wavelength λ as in examples 1 to 3.

In addition, the sizes L1 and L2 of the opening portions of the electromagnetic shielding 104 are at least the wavelength λ of the terahertz waves 202 to be oscillated by the elements 161, not more than ½ of the wavelength of the electromagnetic waves 211 to be shielded, desirably not more than ⅕, and more desirably not more than 1/10.

Specifically, the line widths W1 and W2 and thickness t1 are set to 0.2 mm and the sizes L1 and L2 of the opening portions are set to 0.9 mm in example 4.

Meanwhile, the lens 107 can be disposed in the oscillation apparatus 110 as in examples 2 and 3. That is, the lens 107 may be disposed in front of the surface 115 of the element substrate 111 which oscillates the terahertz waves 202.

According to this configuration, it is possible to effectively shield the unnecessary electromagnetic waves 211 without attenuating the oscillating terahertz waves 202.

Although detected or oscillated electromagnetic waves are terahertz waves in the above-described embodiments 1 and 2 and examples 1 to 4, detected or oscillated electromagnetic waves may be electromagnetic waves having any wavelength, for example, electromagnetic waves having a shorter wavelength than the terahertz waves. Likewise, the wavelength of electromagnetic waves shielded from leakage may also be electromagnetic wave having any wavelength.

Embodiment 3

Figure 8:
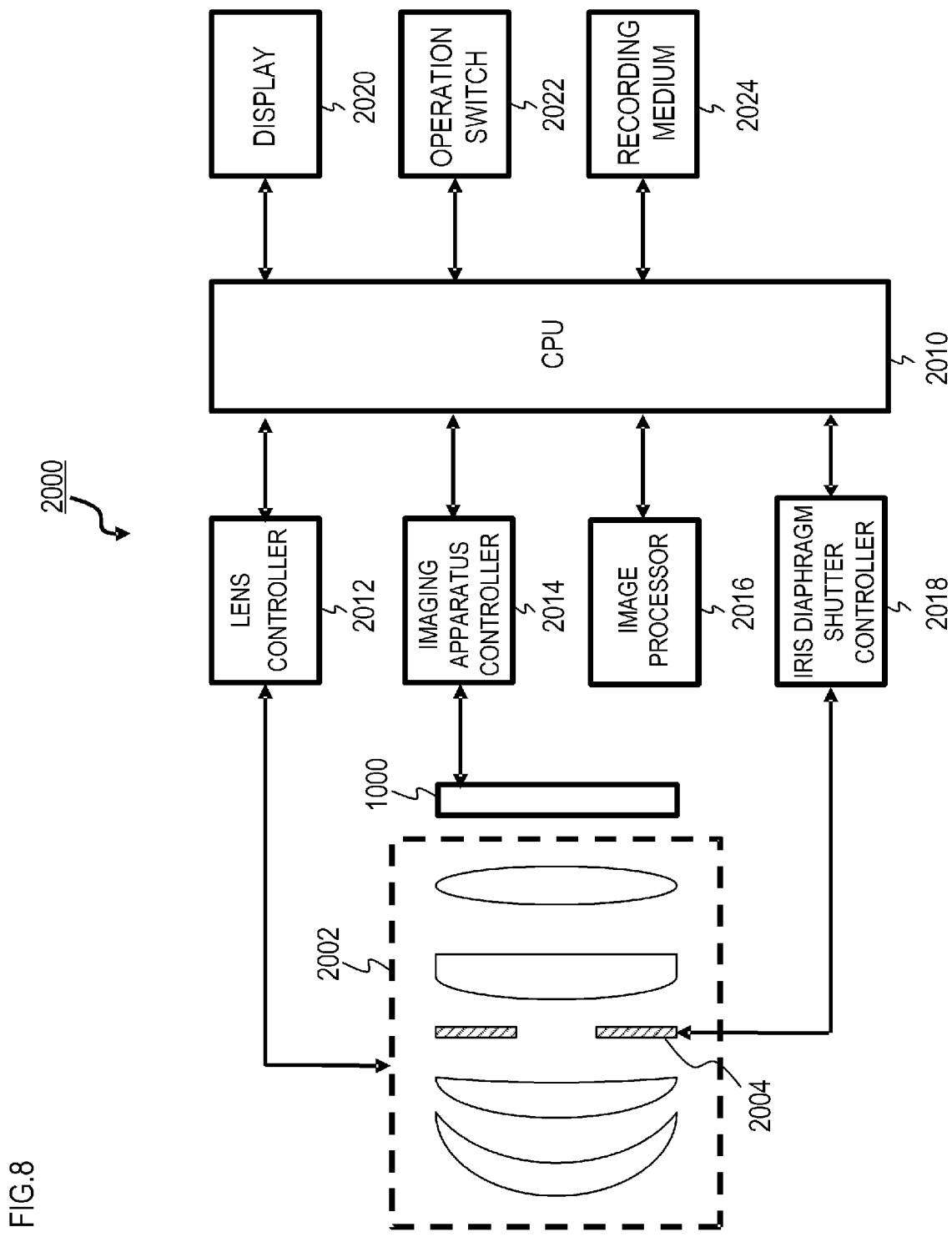
FIG. 8 is a diagram representing an example of a configuration of an imaging system according to embodiment 3.

An imaging system according to embodiment 3 of the present disclosure will be described using FIG. 8. FIG. 8 is a block diagram showing a schematic configuration of the imaging system according to the present embodiment.

The detection apparatus 100 (imaging apparatus) described in embodiment 1 is applicable to various imaging systems. Although imaging systems to which the detection apparatus 100 is applicable are not particularly limited, for example, various apparatuses such as digital still cameras, digital camcorders, monitoring cameras, copying machines, facsimile, cellular phones, on-board cameras, observation satellites, and medical cameras are conceivable. In addition, a camera module including an optical system such as a lens and an imaging apparatus (photoelectric conversion apparatus) is also included in imaging systems. FIG. 8 illustrates a block diagram of a digital still camera as an example of such apparatuses.

As shown in FIG. 8, an imaging system 2000 includes an imaging apparatus 1000, an imaging optical system 2002, a CPU 2010, a lens controller 2012, an imaging apparatus controller 2014, and an image processor 2016. In addition, the imaging system 2000 includes an iris diaphragm shutter controller 2018, a display 2020, an operation switch 2022, and a recording medium 2024.

The imaging optical system 2002 is an optical system for forming an optical image of a subject and includes a lens group, an iris diaphragm 2004, and the like. The iris diaphragm 2004 has a function as a shutter for controlling an exposure time during photographing of still images in addition to a function of controlling the amount of light during photographing by controlling the aperture thereof. The lens group and the iris diaphragm 2004 are held in an optical-axis direction such that they can advance and retreat and a magnification function (zooming function) and a focus control function are realized by operations of these components in connection. The imaging optical system 2002 may be integrated into the imaging system or may be an imaging lens that can be attached to the imaging system.

The imaging apparatus 1000 is disposed such that an imaging surface thereof is positioned in an image space of the imaging optical system 2002. The imaging apparatus 1000 is the detection apparatus 100 described in embodiment 1 and includes a CMOS sensor (pixel part) and a peripheral circuit (peripheral circuit area) thereof. The imaging apparatus 1000 constitutes a two-dimensional single-plate color sensor according to two-dimensional arrangement of pixels including a plurality of photoelectric converters and arrangement of color filters with respect to the pixels. The imaging apparatus 1000 photoelectrically converts a subject image imaged by the imaging optical system 2002 and outputs the converted image as an image signal and a focus detection signal.

The lens controller 2012 is a component for performing a magnification operation and a focus control by controlling forward and backward driving of the lens group of the imaging optical system 2002 and is composed of a circuit and a processing device configured to realize that function. The iris diaphragm shutter controller 2018 is a component for changing the aperture of the iris diaphragm 2004 (varies a diaphragm value) to control the amount of light for photographing and is composed of a circuit and a processing device configured to realize that function.

The CPU 2010 is a control device in the camera which executes various controls of the camera body and includes an arithmetic operation part, a ROM, a RAM, an A/D converter, a D/A converter, a communication interface circuit, and the like. The CPU 2010 controls operations of respective parts of the camera according to a computer program stored in the ROM and the like and performs a series of photographing operations such as AF including detection of a focus state of the imaging optical system 2002

(focus detection), imaging, image processing and recording. The CPU 2010 is also a signal processor.

The imaging apparatus controller 2014 is a component for controlling operation of the imaging apparatus 1000, performing A/D conversion on a signal output from the imaging apparatus 1000 and transmitting the converted signal to the CPU 2010 and is composed of a circuit and a processing device configured to realize those functions. The A/D conversion function may be included in the imaging apparatus 1000. The image processor 2016 is a processing device which generates an image signal by performing image processing such as γ conversion and color interpolation on an A/D converted signal and is composed of a circuit and a processing device configured to realize that function. The display 2020 is a display device such as a liquid crystal display (LCD) and displays information about a photographing mode of the camera, a preview image before photographing, an image for checking after photographing, a focusing state during focus detection, and the like. The operation switch 2022 is composed of a power switch, a release (photographing trigger) switch, a zoom operation switch, a photographing mode selection switch, and the like. The recording medium 2024 is a component for recording photographed images and the like and may be embedded in the imaging system or may be a detachable component such as a memory card.

In this manner, an imaging system with high performance can be realized by configuring the imaging system 2000 to which the detection apparatus 100 according to embodiment 1 is applied.

Embodiment 4

Figure 9A:
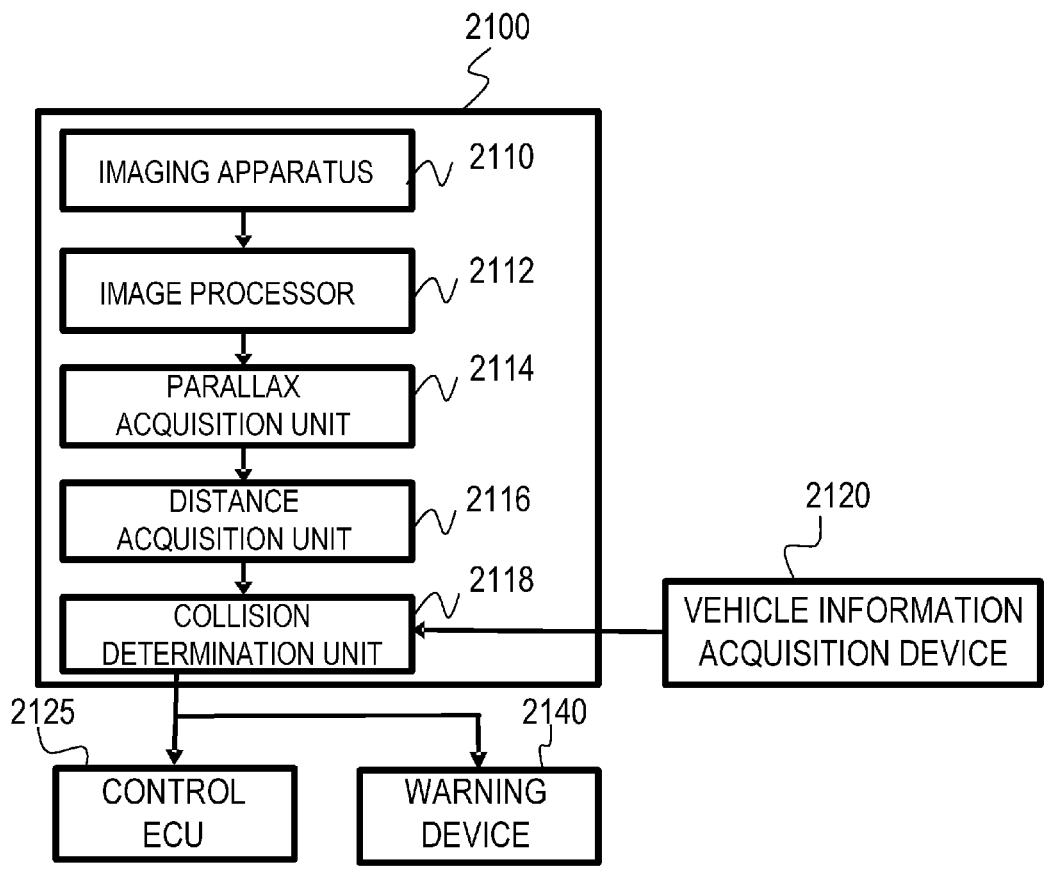
FIG. 9A is a diagram for describing an imaging system according to embodiment 4.
Figure 9B:
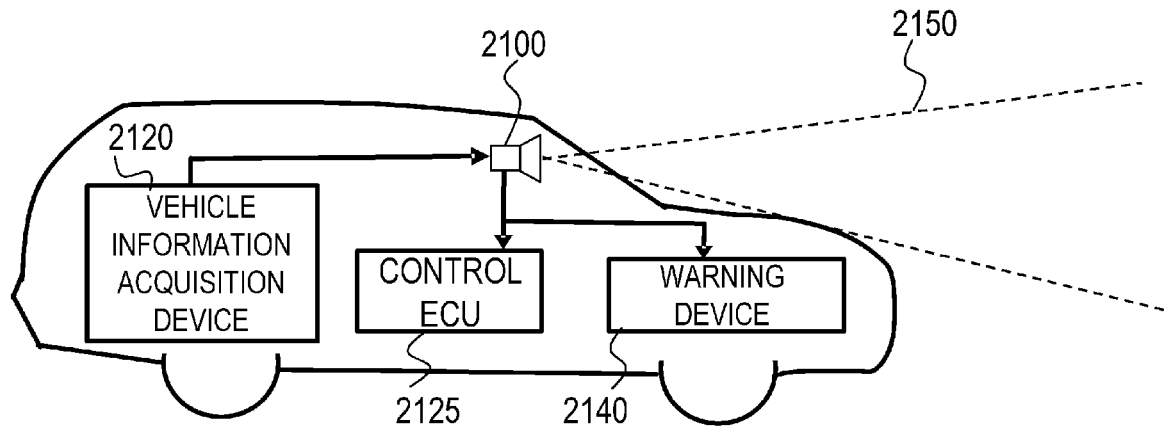
FIG. 9B is a diagram representing an example of a configuration of a moving object according to embodiment 4.

An imaging system and a mobile body according to embodiment 4 of the present disclosure will be described using FIG. 9A and FIG. 9B. FIG. 9A and FIG. 9B are diagrams showing configurations of an imaging system and a moving object according to the present embodiment.

FIG. 9A shows an example of an imaging system 2100 with respect to an on-board camera. The imaging system 2100 includes an imaging apparatus 2110. The imaging apparatus 2110 is the detection apparatus 100 described in the above-described embodiment 1. The imaging system 2100 includes an image processor 2112 which is a processing device for performing image processing on a plurality of pieces of image data acquired by the imaging apparatus 2110. The imaging system 2100 includes a parallax acquisition unit 2114 which is a processing device for calculating a parallax (a phase difference of parallax images) from a plurality of pieces of image data acquired by the imaging apparatus 2110. In addition, the imaging system 2100 includes a distance acquisition unit 2116 which is a processing device for calculating a distance to an object on the basis of a calculated parallax. The imaging system 2100 includes a collision determination unit 2118 which is a processing device for determining whether there is a possibility of collision on the basis of a calculated distance. Here, the parallax acquisition unit 2114 and the distance acquisition unit 2116 are an example of an information acquisition means for acquiring information such as information on a distance to an object. That is, distance information is information about a parallax, a defocus amount, a distance to an object, and the like. The collision determination unit 2118 may determine a possibility of collision using any of such distance information. The aforementioned processing devices may be realized by hardware designed for dedicated purposes or realized by general-purpose hardware which performs arithmetic operations on the basis of a software module. Furthermore, the processing devices may be realized by field programmable gate arrays (FPGAs), application specific integrated circuits (ASICs) or the like. Moreover, the processing devices may be realized by a combination thereof.

The imaging system 2100 is connected to a vehicle information acquisition device 2120 and can acquire vehicle information such as a vehicle speed, a yaw rate and a steering angle. In addition, the imaging system 2100 is connected to a control ECU 2125 which is a control device for outputting a control signal for generating braking power for a vehicle on the basis of a determination result of the collision determination unit 2118. That is, the control ECU 2125 is an example of a moving object control means for controlling a moving object on the basis of distance information. Furthermore, the imaging system 2100 is also connected to a warning device 2140 for giving a warning to a driver on the basis of a determination result of the collision determination unit 2118. For example, in case of a high possibility of collision as a determination result of the collision determination unit 2118, the control ECU 2125 may perform vehicle control for avoiding a collision and reducing damage by braking the vehicle, returning the accelerator, and suppressing engine power. The warning device 2140 warns a user by performing operations of giving an alarm such as sound, displaying warning information on a screen of a car navigation system or the like, vibrating a seatbelt or steering, and the like.

In the present embodiment, the surrounding of a vehicle, for example, the front or back is imaged using the imaging system 2100. FIG. 9B shows the imaging system 2100 when the front of a vehicle (imaging range 2150) is imaged. The vehicle information acquisition device 2120 transmits an instruction for operating the imaging system 2100 to perform imaging. The imaging system 2100 of the present embodiment can improve distance measurement accuracy by using the detection apparatus 100 of the above-described embodiment 1 as the imaging apparatus 2110.

Although an example of controlling a vehicle such that the vehicle does not collide with other vehicles has been described above, the present disclosure is also applicable to control of automated driving while following other vehicles, control of automated driving within lanes, and the like. Furthermore, the imaging system is not limited to vehicles such as cars and can be applied to, for example, moving objects (transportation apparatuses) such as ships, aircrafts or industrial robots. Moving devices in moving objects (transportation apparatuses) are various driving sources such as an engine, a motor, a vehicle wheel and a propeller. In addition, the present disclosure is not limited to moving objects and can be applied to apparatuses using wide object recognition, such as an intelligent transport system (ITS).

OTHER EXAMPLES

Configurations and processing described in the above-described embodiments and examples of the present disclosure can be arbitrarily combined and used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-11827, filed on Jan. 28, 2019, which is hereby incorporated by reference herein in its entirety.

What is claimed is:

1. A semiconductor apparatus comprising:
an element substrate including a plurality of semiconductor devices which detect or oscillate terahertz waves; and
an electromagnetic shielding in a mesh form disposed in front of a surface detecting or oscillating the terahertz waves in the element substrate and formed of a conductive material, wherein
a line width of the electromagnetic shielding is not more than a wavelength of the terahertz waves, and
a width of each opening portion of the electromagnetic shielding is at least the wavelength of the terahertz waves.

2. The semiconductor apparatus according to claim 1, wherein the width of each opening portion of the electromagnetic shielding is not more than ½ of a wavelength of millimeter waves.

3. The semiconductor apparatus according to claim 1, wherein the thickness of the electromagnetic shielding is not more than the wavelength of the terahertz waves.

4. The semiconductor apparatus according to claim 1, further comprising a circuit board including a circuit which reads signals output from the plurality of semiconductor devices or drives the plurality of semiconductor devices, wherein
the plurality of semiconductor devices are two-dimensionally arranged on the element substrate, and the circuit board and the element substrate are integrally disposed.

5. The semiconductor apparatus according to claim 1, wherein a lens which controls an optical path of the terahertz waves is disposed in front of the surface detecting or oscillating the terahertz waves in the element substrate.

6. A semiconductor apparatus comprising:
an element substrate including a plurality of semiconductor devices which detect or oscillate predetermined electromagnetic waves; and
an electromagnetic shielding in a mesh form disposed in front of a surface detecting or oscillating the predetermined electromagnetic waves in the element substrate and formed of a conductive material, wherein
a wavelength of the predetermined electromagnetic waves is in a range of 0.1 mm to 1 mm,
a line width of the electromagnetic shielding is not more than 1 mm, and
a width of each opening portion of the electromagnetic shielding is at least the wavelength of the predetermined electromagnetic waves.

7. The semiconductor apparatus according to claim 6, wherein the width of each opening portion of the electromagnetic shielding is not more than 25 mm.

8. The semiconductor apparatus according to claim 7, wherein the width of each opening portion of the electromagnetic shielding is not more than 1.5 mm.

9. The semiconductor apparatus according to claim 6, wherein the thickness of the electromagnetic shielding is not more than 1 mm.

10. An imaging system comprising:
the semiconductor apparatus according to claim 1; and
a signal processor which processes signals output from the semiconductor apparatus.

11. A moving object comprising:
the semiconductor apparatus according to claim 1;
a moving device;
a processing device which acquires information from signals output from the semiconductor apparatus; and
a control device which controls the moving device on the basis of the information.

* * * * *